(12) United States Patent
Mitsui et al.

(10) Patent No.: US 7,282,554 B2
(45) Date of Patent: Oct. 16, 2007

(54) LOW MOLECULAR WEIGHT POLYPHENYLENE ETHER

(75) Inventors: Akira Mitsui, Sodegaura (JP); Hiroaki Furukawa, Sodegaura (JP); Nobuyuki Ota, Sodegaura (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 10/500,701

(22) PCT Filed: Feb. 28, 2003

(86) PCT No.: PCT/JP03/02302

§ 371 (c)(1),
(2), (4) Date: Jul. 2, 2004

(87) PCT Pub. No.: WO03/076495

PCT Pub. Date: Sep. 18, 2003

(65) Prior Publication Data

US 2005/0070685 A1    Mar. 31, 2005

(30) Foreign Application Priority Data

Mar. 8, 2002    (JP)    ............................ 2002-063626

(51) Int. Cl.
*C08G 65/38*    (2006.01)
*C08G 65/44*    (2006.01)

(52) U.S. Cl. ...................... 528/217; 528/212; 528/214; 528/501; 528/503; 264/50; 264/45.9

(58) Field of Classification Search ................ 528/217, 528/212, 214, 501, 503; 264/50, 45.9
See application file for complete search history.

(56) References Cited

U.S. PATENT DOCUMENTS 4,463,164 A * 7/1984 Dalton et al. ................ 528/212
6,211,327 B1    4/2001 Braat et al.

FOREIGN PATENT DOCUMENTS

| JP | 49-025095 A | 3/1974 |
| JP | 49-26318 | 7/1974 |
| JP | 49-26919 | 7/1974 |
| JP | 62-39628 A | 2/1987 |
| JP | 2000-281779 A | 10/2000 |
| JP | 2003-12796 A | 1/2001 |
| WO | 00/46273 A1 | 8/2000 |
| WO | WO 00/46273 A1 | 8/2000 |

* cited by examiner

*Primary Examiner*—Duc Truong
(74) *Attorney, Agent, or Firm*—Birch, Stewart, Kolasch & Birch, LLP

(57) ABSTRACT

A low molecular weight polyphenylene ether having a reduced viscosity of 0.04 to 0.18 dl/g as measured at 30° C. in a 0.5 g/dl chloroform solution, and a molecular weight distribution of 1.5 to 2.5; or a low molecular weight polyphenylene ether powder comprising the low molecular weight polyphenylene ether exhibits high thermal resistance and excellent electric properties, and thus is useful as electric materials such as printed circuit board and as modifiers of other resins.

17 Claims, No Drawings

LOW MOLECULAR WEIGHT POLYPHENYLENE ETHER

TECHNICAL FIELD

The present invention relates to a low molecular weight polyphenylene ether, particularly to a low molecular weight polyphenylene ether having high thermal resistance, excellent electric properties and solubility to various solvents or reagents, and having good ability of mixing or reacting with other components. The present invention also pertains to a process for producing the low molecular weight polyphenylene ether efficiently, and the low molecular weight polyphenylene ether obtained thereby.

BACKGROUND ART

Polyphenylene ethers have been used widely as a material for products or parts in electrical or electronic fields, automotive fields, other industrial material fields, and food or packaging fields, because they are excellent in workability and productivity, and can be produced as products or parts of a desired shape by melt injection or melt extrusion molding methods.

A number of preparation processes of polyphenylene ethers have been proposed, for example, by JP-B-36-18692 (The term "JP-B" used herein means an "examined Japanese patent publication") and U.S. Pat. Nos. 3,306,875, 3,344,116, and 3,432,466.

The polyphenylene ether, which is obtained by said known method and used in the above-mentioned fields, is a high molecular weight polymer having a reduced viscosity of not less than 0.3 dl/g. Nowadays, however, it is expected that a very low molecular weight polyphenylene ether is more suitable for an electronic material such as a printed circuit board than above-mentioned high molecular weight polyphenylene ether. As the electronic material such as a printed circuit board has become more sophisticated recently, the conductivity-loss of a circuit itself has been more noticeable. Such a conductivity-loss is emitted as heat. Therefore, the material of a printed circuit board is required to have not only good dielectricity but also high thermal resistance. In the process for producing a printed circuit board, it is common to dissolve a material into a solvent to functionalize it by a modification reaction, and conduct a reaction such as thermosetting. Accordingly, it is necessary that a material of a printed circuit board is excellent in solubility in a solvent and have good reactivity with other components.

A low molecular weight polyphenylene ether is disclosed in JP-B-50-6520, JP-A-62-39628 (The term "JP-A" used herein means an "unexamined Japanese patent publication") and U.S. Pat. No. 6,211,327. However, no low molecular weight polyphenylene ether obtained by the methods disclosed in the above-mentioned documents is satisfactory in the point of thermal resistance and electric properties.

JP-B-50-6520 describes a process for producing polyphenylene ether in a mixed solvent comprising an aromatic hydrocarbon solvent such as benzene, toluene and xylene, and an aliphatic hydrocarbon solvent such as n-hexane, isohexane and n-heptane. However, the resultant low molecular weight polyphenylene ether obtained by the method is not satisfactory in the point of thermal resistance and electric properties. As is apparent from the description in the example, when the reduced viscosity of the resultant polyphenylene ether is not more than 0.2 dl/g, the polyphenylene ether adheres on a reactor or the like to reduce the yield.

When a good solvent of polyphenylene ether (an aromatic hydrocarbon solvent such as benzene, toluene and xylene in the above-mentioned document) is, used as a polymerization solvent, the yield is reduced by adhesion of a low molecular weight polyphenylene ether on a reactor since a good solvent has good affinity for the resultant low molecular weight polyphenylene ether. In addition, problems occur such that facilities to remove a good solvent from polyphenylene ether become excessive and that the temperature of such facilities must be controlled very carefully. Therefore, a reduced viscosity at which the low molecular weight polyphenylene ether can be obtained efficiently has remained around 0.2 dl/g at most.

JP-A-62-39628 teaches that, in a process for producing low molecular weight polyphenylene ether having a number average molecular weight smaller than 2,800, a monofunctional alcohol having 1-5 carbon atoms is used optionally with water as a polymerization solvent. The low molecular weight polyphenylene ether obtained by the process cannot be said to have sufficient thermal resistance and electric properties. Moreover, the process described in the document has problems that the polymerization yield achieved is only 95% at maximum, in the examples less than 90%, and that the polymerization takes an extremely long time as described in the examples. Therefore, the process is not efficient in industry.

U.S. Pat. No. 6,211,327 describes a process for producing a low molecular weight polyphenylene ether, which comprises extracting catalyst components from a polyphenylene ether solution in a water phase and then devolatilizing a good solvent of polyphenylene ether from the polyphenylene ether solution using, for instance, a devolatilization extruder. This process is an improved method for producing very low molecular weight polyphenylene ether having a reduced viscosity of 0.1 dl/g or less, which process is free from problems of yield. The low molecular weight polyphenylene ether obtained by this method, however, cannot be said to have sufficient thermal resistance and electric properties.

Further, the low molecular weight polyphenylene ether obtained by the above method is generally in the form of granular particles or pellets. Because large sized particles are contained in the polyphenylene ether, troubles arise such that it requires a long time to dissolve in a solvent or adhere on a reactor in a half-dissolved state.

DISCLOSURE OF THE INVENTION

An object of the present invention is to provide a low molecular weight polyphenylene ether having high thermal resistance, excellent electric properties and good solubility in a solvent. Another object thereof is to provide a method for producing said low molecular weight polyphenylene ether efficiently.

With a view to achieving the above-described objects, the present inventors made extensive investigations, and accomplished the present invention.

The present invention therefore provides:

1. A low molecular weight polyphenylene ether which has a reduced viscosity (ηsp/c), as measured at 30° C. in a 0.5 g/dl chloroform solution, of 0.04-0.18 dl/g, and a molecular weight distribution of 1.5-2.5.

2. The low molecular weight polyphenylene ether according to item 1 above, wherein the glass transition temperature (Tg) of said polyphenylene ether is represented by the following equation:

$Tg$ (° C.)$>600\times(\eta sp/c)+105$

3. A polyphenylene ether powder comprising the low molecular weight polyphenylene ether according to item 1 or 2 above.

4. The polyphenylene ether powder according to item 3 above, which has a mean particle-size of 5.0-1000 μm.

5. The polyphenylene ether powder according to item 3 above, which has a mean particle size of 5.0-500 μm.

6. The polyphenylene ether powder according to item 3 above, which has a mean particle size of 5.0-300 μm.

7. The polyphenylene ether powder according to item 3 above, which has a mean particle size of 5.0-100 μm.

8. The polyphenylene ether powder according to item 3 above, which has substantially no particle having a particle size larger than 1000 μm.

9. The low molecular weight polyphenylene ether according to item 1 above, which is obtained by polymerization of a phenol compound in the presence of a catalyst and oxygen-containing gas.

10. The low molecular weight polyphenylene ether according to item 9 above, wherein the phenol compound comprises a 2,6-dimethylphenol.

11. The low molecular weight polyphenylene ether according to item 9 above, wherein the phenol compound is a mixture comprising 2,6-dimethylphenol and 2,3,6-trimethylphenol.

12. The low molecular weight polyphenylene ether according to item 9 above, wherein the phenol compound is a mixture comprising 2,6-dimethylphenol and 2,6-diphenylphenol.

13. The low molecular weight polyphenylene ether according to any one of items 10-12 above, wherein the phenol compound further comprises a bivalent phenol represented by the following formula (1):

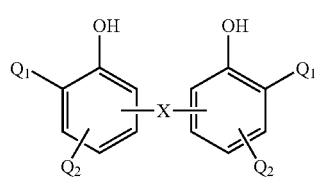

(1)

wherein $Q_1$ and $Q_2$ each represents either the same or a different substituent and represents hydrogen, an alkyl group, a substituted alkyl group, an aralkyl group, a substituted aralkyl group, an aryl group, a substituted aryl group, an alkoxy group, a substituted alkoxy group or halogen; X represents an aliphatic hydrocarbon residue and derivative thereof, oxygen, sulfur or a sulfonyl group; wherein each combined position of each $Q_2$ and X is in the ortho or para position with respect to the phenolic hydroxyl group.

14. The low molecular weight polyphenylene ether according to item 9 above, wherein the catalyst comprises a copper compound, a halogen compound and a diamine compound represented by the following formula (2):

(2)

wherein $R_1$, $R_2$, $R_3$ and $R_4$ each independently represents hydrogen, a linear or branched $C_{1-6}$ alkyl group, with the proviso that they do not represent hydrogen at the same time; and $R_5$ represents a linear or methyl-branched $C_{2-5}$ alkylene group.

15. The low molecular weight polyphenylene ether according to item 14 above, wherein the catalyst further comprises at least one of a tertiary monoamine compound and a secondary monoamine compound.

16. A process for producing the low molecular weight polyphenylene ether according to item 1 above, which comprises the steps of polymerizing a phenol compound in the presence of a catalyst and oxygen-containing gas using a good solvent of said low molecular weight polyphenylene ether, and adding a poor solvent of said low molecular weight polyphenylene ether to the polyphenylene ether solution obtained by said polymerization to precipitate said low molecular weight polyphenylene ether;

wherein said precipitation is carried out at the temperature in the range of −80 to 20° C.

17. The process according to item 16 above, wherein the poor solvent is an alcohol having 1-10 carbon atoms.

18. The process according to item 16 above, wherein the poor solvent is at least one solvent selected from the group consisting of methanol, ethanol, propanol, butanol, pentanol, hexanol and ethylene glycol.

19. The process according to item 17 or 18 above, wherein the poor solvent further comprises water.

20. A process for producing the low molecular weight polyphenylene ether according to item 1 above, which comprises the steps of polymerizing a phenol compound in the presence of a catalyst and oxygen-containing gas, and precipitating said low molecular weight polyphenylene ether in the course of the polymerization;

wherein the polymerization solvent is a mixture of at least two alcohols.

21. The process according to item 20 above, wherein the polymerization solvent is a mixture of at least two alcohols having 1-10 carbon atoms.

22. The process according to item 20 above, wherein the polymerization solvent is a mixture of at least two alcohols selected from the group consisting of methanol, ethanol, propanol, butanol, pentanol, hexanol and ethylene glycol.

23. The process according to item 16 or 20 above, which further comprises the step of purifying a slurry comprising the precipitated low molecular weight polyphenylene ether by washing;

wherein the washing solvent is at least one solvent selected from the group consisting of methanol, ethanol, propanol, butanol, pentanol, hexanol and ethylene glycol.

24. The process according to item 23 above, wherein the washing solvent further comprises water.

25. The process according to item 23 above, which further comprises the step of removing the contained solvent from a washed low molecular weight polyphenylene ether by drying and devolatilization.

26 The process according to item 16 or 20 above, which further comprises the steps of separating the low molecular weight polyphenylene ether from a slurry comprising the precipitated low molecular weight polyphenylene ether to obtain a wet low molecular weight polyphenylene ether, and removing the contained solvent from said wet low molecular weight polyphenylene ether by drying and devolatilization.

BEST MODE FOR CARRYING OUT THE INVENTION

The low molecular weight polyphenylene ether of the present invention is a low molecular weight polyphenylene ether that has a reduced viscosity ($\eta sp/c$), as measured at 30° C. in a 0.5 g/dl chloroform solution, of 0.04-0.18 dl/g, and a molecular weight distribution (Mw/Mn) of 1.5-2.5.

The reduced viscosity can be obtained by measuring polyphenylene ether in the form of a 0.5 g/dl chloroform solution at 30° C. using a Ubbelohde viscometer. The reduced viscosity of the low molecular weight polyphenylene ether of the present invention is 0.04-0.18 dl/g, preferably 0.04-0.15 dl/g, more preferably 0.05-0.13 dl/g.

The molecular weight distribution can be obtained by using gel permeation chromatography (GPC). A standard polystyrene is preferably used for the measurement of a molecular weight. A GPC-LALLS method wherein GPC is combined with a light scattering method can also be used. The molecular weight distribution (Mw/Mn) of the low molecular weight polyphenylene ether of the present invention is 1.5-2.5, preferably 1.6-2.4. The low molecular weight polyphenylene ether having a molecular weight distribution in that range has better thermal resistance and electric properties than that having the reduced viscosity of the present invention and a molecular weight distribution out of the range of the present invention.

The low molecular weight polyphenylene ether of the present invention has high thermal resistance. As an index to thermal resistance, a glass transition temperature (Tg) is used. It is preferable that the low molecular weight polyphenylene ether has a glass transition temperature obtained by the following equation:

$$Tg\ (°\ C.) > 600 \times (\eta sp/c) + 105$$

wherein Tg represents the glass transition temperature (degree Celsius) of the low molecular weight polyphenylene ether, and $\eta sp/c$ represents the reduced viscosity (unit: dl/g) of the low molecular weight polyphenylene ether measured at 30° C. in a 0.5 g/dl chloroform solution.

The low molecular weight polyphenylene ether of the present invention is preferably powdery. The mean particle size of the low molecular weight polyphenylene ether powder of the present invention is 5.0-1000 μm, preferably 5.0-500 μm, more preferably 5.0-300 μm, most preferably 5.0-100 μm. In addition, it is preferable that the low molecular weight polyphenylene ether powder has substantially no particle that is not smaller than 1000 μm.

The low molecular weight polyphenylene ether of the present invention can be obtained by polymerization a phenol compound in the presence of a catalyst and oxygen-containing gas.

The phenol compound to be used in the present invention is a compound having a structure represented by the following formula (3):

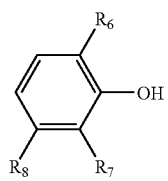

(3)

wherein $R_6$, $R_7$ and $R_8$ is each an individual substituent; $R_6$ represents an alkyl, substituted alkyl, aralkyl, substituted aralkyl, aryl, substituted aryl, alkoxy or substituted alkoxy group; and $R_7$ and $R_8$ each represents, in addition to those described for $R_6$, hydrogen or halogen.

Examples of such a compound include o-cresol, 2,6-dimethylphenol, 2,3,6-trimethylphenol, 2-ethylphenol, 2-methyl-6-ethylphenol, 2,6-diethylphenol, 2-n-propylphenol, 2-ethyl-6-n-propylphenol, 2-methyl-6-chlorophenol, 2-methyl-6-bromophenol, 2-methyl-6-isopropylphenol, 2-methyl-6-n-propylphenol, 2-ethyl-6-bromophenol, 2-methyl-6-n-butylphenol, 2,6-di-n-propylphenol, 2-ethyl-6-chlorophenol, 2-methyl-6-phenylphenol, 2-phenylphenol, 2,6-diphenylphenol, 2,6-bis-(4-fluorophenyl)phenol, 2-methyl-6-tolylphenol and 2,6-ditolylphenol. They may be used either individually or in combination. Incorporation of a small amount of m-cresol, p-cresol, 2,4-dimethylphenol or 2,4,6-trimethylphenol in the above-described compound does not cause any substantial problem. Among these phenol compounds, 2,6-dimethylphenol is particularly industrially important. A combination of 2,6-dimethylphenol and 2,3,6-trimethylphenol or that of 2,6-dimethylphenol and 2,6-diphenylphenol is also used preferably.

Moreover, it is preferable that the phenol compound comprises the bivalent phenol compound represented by the following formula (1):

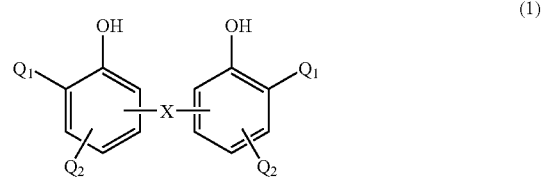

(1)

wherein $Q_1$ and $Q_2$ each represents hydrogen, an alkyl, substituted alkyl, aralkyl, substituted aralkyl, aryl, substituted aryl, alkoxy and substituted alkoxy group and halogen, and they can be either the same or different; X represents an aliphatic hydrocarbon residue and a substituted derivative thereof, oxygen, sulfur and a sulfonyl group; and the combined position of $Q_2$ and X is each ortho or para with respect to the phenolic hydroxyl group.

Examples of such a compound include the group represented by the following formulae (1-a), (1-b) and (1-c):

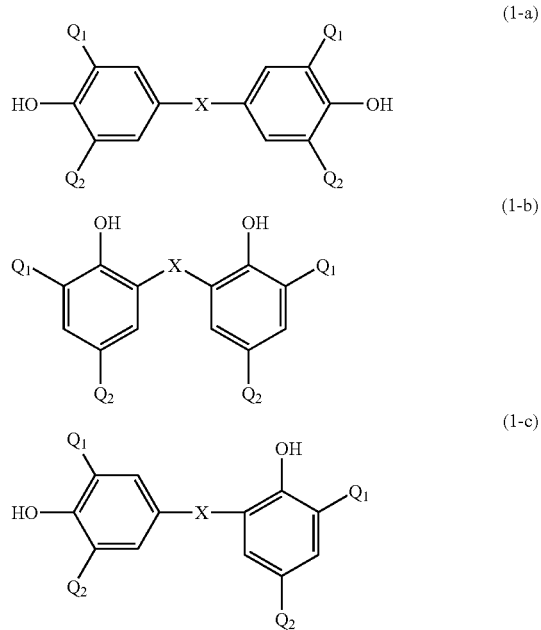

wherein $Q_1$ and $Q_2$ each represents hydrogen, an alkyl, substituted alkyl, aralkyl, substituted aralkyl, aryl, substituted aryl, alkoxy or substituted alkoxy group and halogen, and they can be either the same or different; X represents an aliphatic hydrocarbon residue and a derivative thereof, oxygen, sulfur and a sulfonyl group.

A typical example of the compound having the structure of the above-mentioned formulae is a compound wherein both of $Q_1$ and $Q_2$ are methyl and X is isopropylidene, a compound wherein both of $Q_1$ and $Q_2$ are methyl and X is methylene, a compound wherein both of $Q_1$ and $Q_2$ are methyl and X is thio, a compound wherein both of $Q_1$ and $Q_2$ are methyl and X is cyclohexylidene, and the like. Needless to say, the compound is not limited to the above-mentioned examples.

The biphenolic compounds are used either individually or in combination. The amount of the biphenolic compound is not particularly limited but is preferred to be 0.1-30% by mole to monophenol compounds.

As the catalyst of the present invention, all the known catalyst systems which are commonly applicable to the production of polyphenylene ether can be used. Examples of the known catalyst systems include the combination of a transition metal ion having a redox capability and an amine compound capable of forming a complex with the transition metal ion. For example, such a system includes one comprising a copper compound and an amine compound; one comprising a manganese compound and an amine compound; one comprising a cobalt compound and an amine compound; and the like. Since the polymerization reaction progresses more efficiently under an alkaline condition, a small amount of alkali or an additional small amount of the amine compound can be added to the catalyst system.

Among them, preferably used is the catalyst comprising a copper compound, a halogen compound and a diamine compound represented by the following formula (2):

wherein $R_1$, $R_2$, $R_3$ and $R_4$ each independently represents a hydrogen atom, a linear or branched $C_{1-6}$ alkyl group, with the proviso that they do not represent a hydrogen atom at the same time; and $R_5$ represents a linear or methyl-branched $C_{2-5}$ alkylene group.

Examples of the copper compound mentioned herein as a catalyst component will be described. As the preferred copper compound, cuprous compounds, cupric compounds and mixtures thereof can be used. The cupric compounds include cupric chloride, cupric bromide, cupric sulfate and cupric nitrate, while the cuprous compounds include cuprous chloride, cuprous bromide, cuprous sulfate and cuprous nitrate. Of these cuprous and cupric compounds, particularly preferred are cuprous chloride, cupric chloride, cuprous bromide and cupric bromide. These copper salts may be synthesized upon use from oxides, carbonates or hydroxides of copper, and halogens or acids corresponding thereto. Methods of mixing cuprous, oxide and a hydrogen halide (or a solution of a hydrogen halide) are frequently used for the preparation of such copper salts.

Examples of the halogen compound include hydrogen chloride, hydrogen bromide, hydrogen iodide, sodium chloride, sodium bromide, sodium iodide, potassium chloride, potassium bromide, potassium iodide, tetramethylammonium chloride, tetramethylammonium bromide, tetramethylammonium iodide, tetraethylammonium chloride, tetraethylammonium bromide and tetraethylammonium iodide. These halogen compounds can be used as an aqueous solution or a solution in a proper solvent. These halogen compounds can be used either individually or in combination with two or more thereof. Preferred halogen compounds are an aqueous solution of hydrogen chloride and an aqueous solution of hydrogen bromide.

Although no particular limitation is imposed on the amount of these compounds, they can be employed so that the copper atom will preferably be from 0.02 to 0.6 mole per 100 moles of the phenol compound, and the amount of the halogen atom will be from 2 to 20 times the molar amount of the copper atom.

Examples of the diamine compound as the catalytic component will next be enumerated. Examples thereof include N,N,N',N'-tetramethylethylenediamine, N,N,N'-trimethylethylenediamine, N,N'-dimethylethylenediamine, N,N-dimethylethylenediamine, N-methylethylenediamine, N,N,N',N'-tetraethylethylenediamine, N,N,N'-triethylethylenediamine, N,N'-diethylethylenediamine, N,N-diethylethylenediamine, N-ethylethlenediamine, N,N-dimethyl-N'-ethylethylenediamine, N,N'-dimethyl-N-ethylethylenediamine, N-n-propylethylenediamine, N,N'-n-propylethylenediamine, N-i-propylethylenediamine, N,N'-i-propylethylenediamine, N-n-butylethylenediamine, N,N'-n-butylethylenediamine, N-i-butylethylenediamine, N,N'-i-butylethylenediamine, N-t-butylethylenediamine, N,N'-t-butylethylenediamine, N,N,N',N'-tetramethyl-1,3-diaminopropane, N,N,N'-trimethyl-1,3-diaminopropane, N,N'-dimethyl-1,3-diaminopropane, N-methyl-1,3-diaminopropane, N,N,N',N'-tetramethyl-1,3-diamino-1-methylpropane, N,N,N',N'-tetramethyl-1,3-diamino-2-methylpropane, N,N,N',N'-tetramethyl-1,4-diaminobutane and N,N,N',N'-tetramethyl-1,5-diaminopentane. Preferred diamine compounds are those in which the alkylene group that links the two nitrogen atoms has 2 or 3 carbon atoms. Although no particular limitation is imposed on the use amount of the diamine compound, it is usually employed in an amount ranging from 0.01 to 10 moles per 100 moles of the phenol compound.

To these catalyst components, it is preferable that tertiary monoamine compounds and secondary monoamines are added either individually or in combination as a component in the present invention.

The term "tertiary monoamine compounds" means aliphatic tertiary amines including alicyclic tertiary amines. Examples thereof include, for example, trimethylamine, triethylamine, tripropylamine, tributylamine, triisobutylamine, dimethylethylamine, dimethylpropylamine, aryldiethylamine, dimethyl-n-butylamine, diethylisopropylamine and N-methylcyclohexylamine. These tertiary monoamines can be used either individually or in combination of at least two or more thereof. Although no particular limitation is imposed on the use amount, it is preferably employed in an amount ranging from 0.1 to 10 moles per 100 moles of the phenol compounds.

With regard to the secondary monoamine compounds, examples of secondary aliphatic amines include dimethylamine, diethylamine, di-n-propylamine, di-isopropylamine, di-n-butylamine, di-isobutylamine, di-tert-butylamine, dipentylamines, dihexylamines, dioctylamines, didecylamines, dibenzylamines, methylethylamine, methylpropylamine, methylbutylamine and cyclohexylamine. Examples of secondary aromatic monoamines include N-phenylmethanolamine, N-phenylethanolamine, N-phenylpropanolamine, N-(m-methylphenyl)et-hanolamine, N-(p-methylphenyl)ethanolamine, N-(2',6'-dimethylphenyl)ethanolamine, N-(p-chlorophenyl)ethanolamine, N-ethylaniline, N-butylaniline, N-methyl-2-methylaniline, N-methyl-2,6-dimethylaniline and diphenylamine. The secondary monoamine compounds are however not limited to the above-described ones. They can be used either individually or in combination of at least two or more thereof. Although no particular limitation is imposed on the use amount, it ranges preferably. from 0.05 to 15 moles, more preferably from 0.1 to 10 moles, per 100 moles of the phenol compounds.

The secondary monoamine compound and tertiary monoamine compound can be used either individually or in combination as constituents of the catalyst.

It is also preferable to add a surfactant conventionally known to have an effect of improving the polymerization activity of the polymerization catalyst. For example, trioctylmethylammonium chloride known as the trade name of "Aliquat 336" or "Capriquat" can be used. Its use amount is preferably within a range not exceeding 0.1 wt. % based on the total amount of the whole reaction mixture.

As the oxygen-containing gas to used upon polymerization of the present invention, not only pure oxygen but also a mixture of oxygen and an inert gas such as nitrogen at any ratio, air, or a mixture of air and an inert gas such as nitrogen at any ratio can be used. As the pressure in the system during the polymerization reaction, normal pressure is sufficient, but reaction may be effected under reduced pressure or under pressure as needed.

There is no particular limitation on the temperature of polymerization. Polymerization is preferably conducted at a temperature ranging from 0 to 80° C., more preferably 10 to 70° C., because reaction does not proceed smoothly at an excessively low temperature, while the reaction selectivity becomes low at an excessively high temperature.

No particular limitation is imposed on the treatment after completion of the polymerization reaction. A method wherein an acid such as hydrochloric acid or acetic acid, ethylenediaminetetraacetic acid (EDTA) or a salt thereof, or nitrilotriacetic acid or a salt thereof are added to the reaction mixture to deactivate the catalyst is usually used.

No particular limitation is imposed on the method of treatment of by-product, such as diphenoquinone, which is known to be formed in the common polymerization of polyphenylene ether. As long as a metal ion of a catalyst is in a substantially deactivated state as mentioned above, decolorization is achieved just by heating. The decolorization can be also achieved by adding a reducing agent such as hydroquinone and sodium dithionite in a required amount. There is no limitation to the temperature of this step, but it is preferred to carry out the step under the condition of the temperature of 10-100° C. from the viewpoint of operation.

In general, as a method for obtaining polyphenylene ether, there have been known a precipitation polymerization method wherein a poor solvent of a polyphenylene ether is used as a polymerization solvent and polyphenylene ether is precipitated in the form of particles in the course of polymerization; and a solution polymerization method wherein a good solvent of a polyphenylene ether is used as a polymerization solvent and polyphenylene ether is dissolved in a solvent. The low molecular weight polyphenylene ether of the present invention can be obtained by either of these methods.

Adopting the precipitation polymerization method wherein a poor solvent of a polyphenylene ether is used as a polymerization solvent and polyphenylene ether is precipitated in the form of particles in the course of polymerization, a mixed solvent comprising at least two alcohols must be used as a poor solvent.

As a poor solvent, an alcohol having 1-10 carbon atoms is preferred. More preferable are at least two alcohols selected from the group consisting of methanol, ethanol, propanol, butanol, pentanol, hexanol and ethylene glycol. A poor solvent is preferred not to contain water.

There is no particular limitation on how many kinds of solvent are used as long as two or more are employed. In addition, no particular limitation is imposed on the weight ratio of each solvent in a mixed solvent, and the combination and weight ratio of solvents, which are required to achieve this process, can both be selected from these solvents. Accordingly, an extremely wide range of selection can be provided. From the industrial viewpoint, however, it is natural that limitations are imposed to some extent in consideration of price, difficulty in recovery and the like.

It has been found that the use of a mixed solvent comprising at least two alcohols exhibits extremely unique behavior where the molecular weight of a low molecular weight polyphenylene ether is controllable by changing the weight ratio of the alcohols constituting the mixed solvent and where the polymerization activity and yield are more improved than the case where a single alcohol is used, though each alcohol constituting the mixed solvent is a poor solvent of the low molecular weight polyphenylene ether.

A good solvent may coexist in the polymerization solvent within the range where low molecular weight polyphenylene ether is not dissolved. Therefore, it should be noted that this does not mean that any good solvent is not contained at all in the polymerization solvent. For example, in the case of low molecular weight polyphenylene ether having reduced viscosity of 0.07 dl/g, the mixed solvent of methanol and butanol may contain a small amount (about 1%) of xylene. As the reduced viscosity of polyphenylene ether decreases, the amount of good solvent which can coexist in the polymerization solvent is reduced. In the case of low molecular weight polyphenylene ether having reduced viscosity of 0.04 dl/g, the acceptable amount of xylene in the polymerization solvent is about 50 ppm. The amount of good solvent cannot be flatly determined since it varies depending on the desired reduced viscosity of low molecular weight polyphenylene ether and compatibility to low molecular weight polyphenylene ether. Thus, it is natural that the amount of good solvent varies depending on the kind thereof.

On the other hand, in the case of the solution polymerization method wherein a good solvent of a polyphenylene ether is used as a polymerization solvent and polyphenylene ether is dissolved in a solvent, the poor solvent is added to the solution containing the obtained low molecular weight polyphenylene ether to precipitate low molecular weight polyphenylene ether, the precipitation being carried out at the temperature in the range of −80 to 20° C.

As the good solvent, benzene, toluene, xylene (including isomers thereof, i.e., ortho-, meta-, and para-xylene), ethylbenzene, aromatic hydrocarbons such as styrene, halogenated hydrocarbons such as chloroform, methylene chloride, 1,2-dichloroethane, chlorobenzene, dichlorobenzene, and nitro compounds such as nitrobenzene are included. A preferable good solvent is toluene. As a solvent categorized as a good solvent despite some property as a poor solvent, there can be exemplified aliphatic hydrocarbons such as pentane, hexane, heptane, cyclohexane and cycloheptane; esters such as ethyl acetate and ethyl formate; ethers such as tetrahydrofuran and diethylether; dimethyl sulfoxide; and the like. They can be used either individually or in combination. Moreover, a poor solvent such as alcohols and water may be contained within the range where the reaction mixture obtained after polymerization keeps the form of a solution.

As a result of polymerization, a solution comprising low molecular weight polyphenylene ether and a solvent is obtained. The concentration of the low molecular weight polyphenylene ether in the solution is not particularly limited, but is preferably 25-70% by weight.

A low molecular weight polyphenylene ether is precipitated by adding a poor solvent to the resultant solution. Examples of the poor solvent include ethers, ketones and alcohols. Preferred is an alcohol having 1-10 carbon atoms. More preferred is at least one alcohol selected from the group consisting of methanol, ethanol, propanol, butanol, pentanol, hexanol and ethylene glycol. Moreover, the poor solvent may contain water.

No particular limitation is imposed on the apparatus and means employed in the method for the precipitation of low molecular weight polyphenylene ether. Various methods can be employed such as a method comprising continuously feeding a solution containing low molecular weight polyphenylene ether and a poor solvent to an adequately sized vessel equipped with a stirrer; a method comprising feeding a poor solvent to a vessel with a solution containing low molecular weight polyphenylene ether; a method comprising feeding a solution containing low molecular weight polyphenylene ether to a vessel with a poor solvent; and a method comprising continuously feeding a solution containing low molecular weight polyphenylene ether and a poor solvent to a tube-type static-mixer.

No particular limitation is imposed on the temperature of the solution containing low molecular weight polyphenylene ether and the poor solvent to be fed to the precipitation apparatus. However, very careful attention must be paid to the temperature of the precipitation operation in the apparatus. In order to obtain the low molecular weight polyphenylene ether of the present invention, it is necessary to carry out the precipitation at the temperature in the range of −80 to 20° C. When the temperature is over 20° C., low molecular weight polyphenylene ether cannot be precipitated because of adhesion on the reactor. Although low molecular weight polyphenylene ether can be precipitated under −80° C., extraordinary energy is required to lower the temperature to less than −80° C. Thus, a temperature under −80° C. is inefficient.

A slurry comprising low molecular weight polyphenylene ether and a solvent can be obtained by any of the above-mentioned methods. The low molecular weight polyphenylene ether of the present invention can be obtained through removal of remaining solvent from the slurry. A solvent-removal method includes a method comprising separating the slurry into a solid and liquid to obtain wet low molecular weight polyphenylene ether and drying or devolatilizing the resultant to obtain low molecular weight polyphenylene ether.

There is no limitation on the means for solid-liquid separation, and any of the known methods can be applied. For example, any equipment such as a percolation centrifuge, a centrifuge with a scratch typed stirrer, a vacuum drum type filter, and a nutche are usable. It is noted that, in the case of the slurry obtained by precipitation at low temperature after polymerization using a good solvent, the first separation is carried out at a temperature in the range as mentioned above in describing the precipitation.

Prior to the drying or devolatilization, the wet low molecular weight polyphenylene ether is preferably washed with a poor solvent of the low molecular weight polyphenylene ether. The washing solvent is preferably at least one solvent selected from the group consisting of methanol, ethanol, propanol, butanol, pentanol, hexanol and ethylene glycol. It is also preferred to have water contained in the washing solvent.

The low molecular weight polyphenylene ether can be obtained by drying or devolatilizing the wet low molecular weight polyphenylene ether. There is no particular limitation on the drying. Any of the known methods can be applied. For example, a paddle dryer, a vacuum dryer, a spray dryer, a heat tube dryer and the like can be used. Especially, drying is preferably carried out under an inert gas. Through such a drying, the low molecular weight polyphenylene ether of this invention is obtained in the form of a powder. Devolatilization is a method that comprises removing a volatile solvent and the like by heating the resultant wet low molecular weight polyphenylene ether. The devolatilization includes for example the method wherein wet low molecular weight polyphenylene ether is supplied to a heated devolatilization extruder, extruded from a die while devolatilizing, and cut under cooling to obtain a pellet; and the method wherein an adequate container with the low molecular weight polyphenylene ether is depressurized by heating to obtain a mass of low molecular weight polyphenylene ether of the present invention while eliminating the solvent, and then the mass of the low molecular weight polyphenylene ether is forced out. Any other methods than described herein can also be applied. The low molecular weight polyphenylene ether obtained by devolatilization is in the form of a pellet or a mass. In this invention, it is preferred to reduce the low molecular weight polyphenylene ether to a powder by grinding and the like.

The low molecular weight polyphenylene ethers of the present invention have excellent thermal resistance and electric properties so that they are very advantageously used for electronic materials, which are required to have a low dielectric constant and low dielectric loss. Since the low molecular weight polyphenylene ether powder of the present invention has a small particle size, it dissolves in the solvent extremely rapidly when used for example in the process for producing prep leg and in the processes thereafter. In addition, it can be preferably used for electronic materials from the viewpoint of productivity because of its excellent reactivity with various reagents for modification reactions.

Moreover, the low molecular weight polyphenylene ether of the present invention can be advantageously applied to various thermoplastic resin compositions, thermosetting resins and the like. The low molecular weight polyphenylene ether is capable of plasticizing various thermoplastic resin compositions so that it can be used as a plasticizer. It will be realized that the low molecular weight polyphenylene ether of the present invention can be applied to modified polyphenylene ether obtained by using a normal high molecular weight polyphenylene ether to contribute to an improvement in fluidity.

Examples of the use with a thermoplastic resin include, for example, compositions with a polystyrene resin (including rubber-reinforced polystyrene, AS resin, ABS resin and the like), a polyamide resin, a polyolefin resin, a polyester resin, a liquid crystal resin, thermoplastic elastomer or the like, while examples of the use with a thermosetting resin include, for example, a composition with an epoxy, unsaturated polyester, polyurethane, crosslinked aryl, bismaleimide, phenolic resin or the like. The thermoplastic resins and thermosetting resins are however not. limited to these examples. In particular, the low molecular weight polyphenylene ether has flame retardancy, which is inherent in polyphenylene ether, so that it is useful as an additive to give thermal resistance to a substance having low thermal resistance or an additive to give flame retardancy to a substance having low flame retardancy. Particularly, it is very useful for improvement of polystyrene or thermoplastic elastomers.

When a composition comprising the low molecular weight polyphenylene ether of the present invention is prepared, additives other than the above-described ones can be incorporated. Examples thereof include plasticizers, stabilizers, modifiers, ultraviolet absorbers, flame retardants, coloring agents, mold release agents, fibrous reinforcing materials such as glass fibers and carbon fibers, and fillers such as glass beads, calcium carbonate and talc. Examples of the stabilizers or modifiers include, but are not limited to, phosphites, hindered phenols, sulfur-containing antioxidants, alkanolamines, acid amides, metal salts of dithiocarbamic acid, inorganic sulfides, metal oxides, carboxylic anhydrides, dienophile compounds such as styrene and stearyl acrylate, and epoxy group containing compounds. These additives can be used either individually or in combination.

Components constituting the resin composition containing the low molecular weight polyphenylene ether of the present invention can be mixed in any manner. For example, a solution blending and devolatilization method, extruder, heating roller, Banbury mixer, kneader, Henschel mixer or the like can be used.

EXAMPLES

The present invention will be described in more detail with reference to the following. Examples, but the invention should not be construed as being limited thereto.

Each measurement was carried out by the method described below.

(1) Reduced Viscosity ($\eta$sp/c)

The reduced viscosity of the polyphenylene ether, which was obtained in each Example and formed in a 0.5 g/dl chloroform solution, was measured at 30° C. by using an Ubbelohde viscometer. The unit is dl/g.

(2) Yield of Polyphenylene Ether

The yield of polyphenylene ether was expressed in weight percentage of dried polyphenylene ether to the phenolic compound used.

(3) Molecular Weight Distribution

The molecular weight distribution was determined using a working curve which was obtained from ethylbenzene and standard polystyrene samples with a gel permeation chromatography device ("SHODEX GPCsystem 21" manufactured by Showa Denko K. K.). The standard polystyrene samples used above had a molecular weight of 550, 1,300, 2,960, 9,680, 28,600, 65,900, 172,000, 629,000, 996,000, 1,960,000 and 3,900,000. Two chromatographic columns ("K-802.5" manufactured by Shodex) connected in series were used. The measurement was conducted using chloroform as a solvent with a solvent flow rate of 1.0 ml/min at a column temperature of 40° C. A UV detector was used as a detector. The wavelengths of ultraviolet rays of 254 nm and 283 nm were used to obtain a working curve of standard polystyrene samples and to measure the molecular weight of polyphenylene ether, respectively. Samples were dissolved in chloroform and the resultant solution, from which substances not dissolved were removed using a membrane filter, was subjected to measurement. The molecular weight distribution (Mw/Mn), a ratio of the weight average molecular weight (Mw) and number average molecular weight (Mn), was obtained.

(4) Particle Size of Polyphenylene Ether

The polyphenylene ether obtained in each Example described below was passed through a sieve having a size of 1,000 μm, and the polyphenylene ether remaining on the sieve was weighed. The polyphenylene ether passed through the sieve was dispersed in methanol to measure the particle size thereof using a laser-type particle size analyzer ("SALD-2000" manufactured by Shimadzu corporation). In the case where the weight of polyphenylene ether remaining on the sieve exceeded 50% by weight of the weight of the total polyphenylene ether, the particle size of polyphenylene ether was determined to ">1,000 μm."

(5) Glass Transition Temperature (Tg) of Polyphenylene Ether

The glass transition temperature was measured by scanning twice while heating from 50° C. to 300° C. at the rate of 20° C./min under nitrogen atmosphere using a differential scanning calorimeter (Pyris1, manufactured by Perkin-Elmer Japan Inc.). The glass transition temperature was obtained from a specific heat curve of the second scanning.

(6) Dielectric Constant of Polyphenylene Ether

A polyphenylene ether was press molded by using a mold having a size of 150 mm×150 mm×2 mm and a press molding machine (test press "YSR-10" manufactured by Shinto kinzoku kougyousyo Co.,Ltd.). Using a part of the resultant press molded piece, the dielectric constant at 1 MHz was measured based on JIS-K6911. As a measuring equipment, Presion LCR meter ("HP-4284A" manufactured by Hewlett-Packard Co.,Ltd.) was used.

Example 1

In a 1.5-L jacketed reactor equipped with a sparger to introduce an oxygen-containing gas, a stirring turbine blade and a baffle, each at the bottom of the reactor, and a reflux condenser in a vent gas line at the upper portion of the reactor, 0.2512 g of cupric chloride dihydrate, 1.1062 g of 35% hydrochloric acid, 3.6179 g of di-n-butylamine, 9.5937 g of N,N,N',N'-tetramethylpropanediamine, 211.63 g of methanol, 493.80 g of n-butanol and 180.0 g of 2,6-dimethylphenol were charged. The weight ratio of each solvent component was n-butanol/methanol=70/30. Under vigorous stirring, the introduction of oxygen from the sparger was started at a rate of 180 ml/min. At the same time, the polymerization temperature was adjusted and kept at 40° C. by introducing a heating medium in the jacket. The polymer solution became a slurry in progression. No adhesion was observed on the reactor during the polymerization. 120 minutes later from the initiation of oxygen introduction, the introduction of oxygen was stopped and a 10% aqueous solution of tripotassium salt of ethylenediaminetetraacetic acid (a reagent manufactured by Doujin Laboratories) was added to the resultant polymerization mixture, and heated to 50° C. Then, hydroquinone (manufactured by Wako pure Chemical Industries, Ltd.) was added to the mixture little by little, and kept at 50° C. until the polyphenylene ether in the form of a slurry turned white. After the slurry becomes white, wet polyphenylene ether obtained by filtration of the mixture was charged to a methanol washing solution containing 50% by weight of water, and stirred at 60° C. The resultant mixture was filtered, and methanol containing 50% by weight of water was drizzled over the filtrate to obtain wet polyphenylene ether. The wet polyphenylene ether was vacuum-dried at 110° C. to obtain dry polyphenylene ether. The mean particle size of the resultant polyphenylene ether was 56 μm, and no particles larger than 1000 μm existed. Reduced viscosity ($\eta sp/c$), yield, molecular weight distribution, glass transition temperature (Tg) and dielectric constant were measured. The results are shown in Table 1.

Example 2

The same method as in Example 1 was repeated except that the weight ratio of each component was changed to n-butanol/methanol=30/70. No adhesion was observed on the reactor during the polymerization. The mean particle size of the resultant polyphenylene ether was 34 μm, and no particles larger than 1000 μm existed. Each measurement was carried out in the same manner as in Example 1. The results are shown in Table 1.

Example 3

The same method as in Example 1 was repeated except that the weight ratio of each component was changed to n-butanol/methanol=10/90. No adhesion was observed on the reactor during the polymerization. The mean particle size of the resultant polyphenylene ether was 39 μm, and no particles larger than 1000 μm existed. Each measurement was carried out in the same manner as in Example 1. The results are shown in Table 1.

Comparative Example 1

The same method as in Example 1 was repeated except that the weight ratio of each component was changed to n-butanol/methanol=0/100, that is, methanol was used as a sole solvent, and the polymerization period changed to 240 minutes. No adhesion was observed on the reactor during the polymerization. The mean particle size of the resultant polyphenylene ether was 15 μm, and no particles larger than 1000 μm existed. Each measurement was carried out in the same manner as in Example 1. The results are shown in Table 1.

Comparative Example 2

The same method as in Example 1 was repeated except that, as a solvent, n-butanol saturated with water was used singly and the polymerization period was changed to 240 minutes. No adhesion was observed on the reactor during the polymerization. The mean particle size of the resultant polyphenylene ether was 39 μm, and no particles larger than 1000 μm existed. Each measurement was carried out in the same manner as in Example 1. The results are shown in Table 1.

Comparative Example 3

The same method as in Example 1 was repeated except that the weight ratio of each component was changed to xylene/n-butanol/methanol=60/20/20 and methanol was used as a washing solvent. Much adhesion was observed on the reactor during the polymerization. The mean particle size of the resultant polyphenylene ether was 920 μm, and particles larger than 1000 μm existed in an amount of 46% by weight. Each measurement was carried out in the same manner as in Example 1. The results are shown in Table 1.

Comparative Example 4

The same method as in Comparative Example 3 was repeated except that the polymerization period was changed to 55 minutes. Much adhesion was observed on the reactor during the polymerization. The mean particle size of the resultant polyphenylene ether was 850 μm, and particles larger than 1000 μm existed in an amount of 38% by weight. Each measurement was carried out in the same manner as in Example 1. The results are shown in Table 1.

Example 4

The same method as in Example 2 was repeated except that, as a phenol compound, a mixture comprising 126 g of 2,6-dimethylphenol and 54 g of 2,3,6-trimethylphenol was used. No adhesion was observed on the reactor during the polymerization. The mean particle size of the resultant polyphenylene ether was 43 μm, and no particles larger than 1000 μm existed. Each measurement was carried out in the same manner as in Example 1. The results are shown in Table 1.

Example 5

The same method as in Example 2 was repeated except that a mixture comprising 126 g of 2,6-dimethylphenol and 54 g of 2,6-diphenylphenol was used as a phenol compound, 0.1690 g of N,N,N',N'-tetramethylethylenediamine was used as a diamine being a component of the catalyst, the polymerization temperature was changed to 60° C., and the polymerization period was changed to. 180 minutes. No adhesion was observed on the reactor during the polymerization. The mean particle size of the resultant polyphenylene ether was 33 μm, and no particles larger than 1000 μm existed. Each measurement was carried out in the same manner as in Example 1. The results are shown in Table 1.

Example 6

The same method as in Example 1 was repeated except that the weight ratio of each component was changed to n-hexanol/methanol=10/90 and a mixture comprising methanol/water=90/10 (weight ratio) was used as a washing solvent. No adhesion was observed on the reactor during the polymerization. The mean particle size of the resultant polyphenylene ether was 54 μm, and no particles larger than 1000 μm existed. Each measurement was carried out in the same manner as in Example 1. The results are shown in Table 1.

Example 7

The same method as in Example 2 was repeated except that 2,6-dimethylphenol containing 2.5% by mole of 2,2-bis(3,5-dimethyl-4-hidroxyphenyl)propane was used as a phenol compound. No adhesion was observed on the reactor during the polymerization. The mean particle size of the resultant polyphenylene ether was 42 μm, and no particles larger than 1000 μm existed. Each measurement was carried out in the same manner as in Example 1. The results are shown in Table 1.

Example 8

The same method as in Example 1 was repeated except that the weight ratio of each component was changed to n-butanol/methanol/xylene=85/14.25/0.75. No adhesion was observed on the reactor during the polymerization. The mean particle size of the resultant polyphenylene ether was 54 μm, and no particles larger than 1000 μm existed. Each measurement was carried out in the same manner as in Example 1. The results are shown in Table 1.

Comparative Example 5

According to the method described in the Example of U.S. Pat. No. 6,211,327, the reaction was carried out. Namely, 2,6-dimethylphenol was polymerized in a toluene solvent at the temperature of 40-45° C. with stirring while supplying oxygen. Then, the supply of oxygen was stopped. An aqueous solution of nitrilotriacetic acid was added with stirring in nitrogen atmosphere to extract a copper catalyst in the water phase and heated to the temperature of 55° C., which was kept for 70 minutes. The reaction mixture obtained was separated in a toluene phase where a polyphenylene ether was dissolved and a water phase where copper compound was dissolved using a sharples liquid-liquid centrifuge. The resultant polyphenylene ether solution was condensed by removing toluene until the solid portion became 65%, and then the condensed solution was devolatilized using a devolatilization extruder to obtain pelletized low molecular weight polyphenylene ether. The mean particle size of the resultant polyphenylene ether was not smaller than 1000 μm, and particles larger than 1000 μm existed in an amount of 97% by weight. Reduced viscosity (ηsp/c), molecular weight distribution, glass transition temperature (Tg) and dielectric constant were measured. The results are shown in Table 1.

Example 9

According to the method described in Example 3 of JP-B-59-23332, the polymerization was carried out. While supplying oxygen, a toluene solution containing 50% by weight of 2,6-dimethylphenol was added over 35 minutes to a toluene solution catalyst comprising cuprous bromide, hydrogen bromide, N,N'-di-t-butylethylenediamine, N,N-dimethyl-n-butylamine and di-n-butylamine. The supply of oxygen was stopped 74 minutes later. An aqueous solution of the trisodium salt of ethylenediaminetetraacetic acid was added to the polymerization mixture, and the mixture was kept at a temperature of 70° C. The reaction mixture obtained was separated in a toluene phase where a polyphenylene ether was dissolved and water phase where copper compound was dissolved using a sharples liquid-liquid centrifuge. Then, the resultant mixture was transferred to a centrifuge manufactured by Sharples Corp. to obtain a polyphenylene ether solution containing 26% by weight of polyphenylene ether, which was determined "(A)." A jacketed precipitation tank with an overcoat-jacket having a stirring turbine blade and a baffle inside thereof was used. The polyphenylene ether solution "(A)" was charged to the tank in an amount shown in Table 2, Condition a, and the temperature was kept at −10° C. by letting a coolant flow in the jacket while stirring. Further, methanol of which the temperature was adjusted at −10° C. was added in an amount shown in Table 2, Condition a. As a result, the weight ratio of methanol as a poor solvent and toluene as a good solvent was methanol/toluene=2.5. When a slurry wherein polyphenylene ether was precipitated by reacting the solutions with each other was obtained, it was filtered with a nutche and washed by drizzling methanol of which the temperature was adjusted to −10° C. The obtained filtrate was vacuum dried at the temperature of 140° C. for 1 hour.

The mean particle size of the resultant polyphenylene ether was 42 μm, and no particles larger than 1000 μm existed. Each measurement was carried out in the same manner as in Example 1. The results are shown in Table 1. The same process was carried out under the conditions that the weight ratios of methanol as a poor solvent, and toluene as a good solvent were 5.0(Condition b), 7.0(Condition c) and 12.0 (Condition d). Under any of the conditions, the polymer was precipitated as a particle and no particles larger than 1000 μm existed. Each measurement was carried out in the same manner as in Example 1. The results are shown in Table 1.

Example 10

The same method as in Example 9 was repeated except that the precipitation temperature was changed to 1° C. in Condition a. Under any of the conditions, the polymer was precipitated as a particle and no particles larger than 1000 μm existed. Each measurement was carried out in the same manner as in Example 1. The results are shown in Table 1.

Comparative Example 6

The same method as in Example 9 was repeated except that the precipitation temperature was changed to 30° C. in Condition a. In this condition, precipitated polymer stuck on a stirring turbine blade and formed a mass so that it was impossible to continue the operation.

TABLE 1

MEASUREMENT RESULT

| No. of experiment | ηsp/c [dl/g] | Yield [%] | Mean Particle Size [μm] | Mw/Mn | Tg [° C.] | Dielectric Constant |
|---|---|---|---|---|---|---|
| Ex. 1 | 0.116 | 97 | 56 | 1.89 | 185 | 2.49 |
| Ex. 2 | 0.082 | 98 | 34 | 1.87 | 167 | 2.52 |
| Ex. 3 | 0.075 | 98 | 39 | 1.92 | 155 | 2.55 |
| Comp. Ex. 1 | 0.070 | 88 | 15 | 1.35 | 135 | 2.80 |
| Comp. Ex. 2 | 0.072 | 76 | 39 | 2.56 | 142 | 2.71 |
| Comp. Ex. 3 | 0.476 | 97 | 920 | 2.58 | 215 | 2.45 |
| Comp. Ex. 4 | 0.195 | 64 | 850 | 2.39 | 205 | 2.47 |
| Ex. 4 | 0.081 | 98 | 43 | 1.85 | 178 | 2.48 |
| Ex. 5 | 0.079 | 97 | 33 | 2.10 | 180 | 2.50 |
| Ex. 6 | 0.085 | 98 | 54 | 1.89 | 169 | 2.48 |
| Ex. 7 | 0.085 | 98 | 42 | 1.87 | 167 | 2.53 |
| Ex. 8 | 0.103 | 97 | 59 | 1.88 | 183 | 2.48 |
| Comp. Ex. 5 | 0.122 | | >1000 | 2.68 | 162 | 2.59 |
| Ex. 9-a | 0.120 | 90 | 256 | 1.75 | 189 | 2.47 |
| Ex. 9-b | 0.116 | 92 | 350 | 1.82 | 188 | 2.47 |
| Ex. 9-c | 0.112 | 92 | 625 | 1.93 | 185 | 2.50 |
| Ex. 9-d | 0.112 | 93 | 280 | 2.08 | 185 | 2.50 |
| Ex. 10-a | 0.124 | 89 | 430 | 1.88 | 189 | 2.46 |
| Comp. Ex. 6 | | | not precipitated | | | |

TABLE 2

PRECIPITATION CONDITION

| Condition | a | b | c | d |
|---|---|---|---|---|
| Polyphenylene ether solution (parts by weight) | 70 | 40 | 30 | 20 |
| Methanol (parts by weight) | 130 | 160 | 170 | 180 |
| Methanol/toluene (weight ratio) | 2.5 | 5.0 | 7.0 | 12.0 |

Referential Example

Using the polyphenylene ethers obtained in Examples 1, 2, 3, 4 and 7, and Comparative Examples 3 and 5, the dissolution rate in methylethylketone was measured. The measurement was carried out in the manner described below. First, 100 g of methylethylketone was charged in a round-bottomed flask, and stirred gently using a magnetic stirrer at the temperature of 20° C. 20 g of polyphenylene ether obtained in each Example and Comparative Example was charged therein. Except the case where the polyphenylene ether of Comparative Example 5 was charged, the mixture was first cloudy, and then became clear. The time from addition of the polyphenylene ether until clarification of the solution (dissolution time) was measured. The condition in the flask at dissolution was observed. The results are shown in Table 3.

TABLE 3

DISSOLUTION TEST OF METHYLETHYLKETONE

|  | Dissolution Time [min] | Condition Observed |
|---|---|---|
| Ex. 1 | 1.1 | |
| Ex. 2 | 0.87 | |
| Ex. 3 | 0.75 | |
| Ex. 4 | 0.92 | |
| Ex. 7 | 0.95 | |
| Comp. Ex. 3 | — | Not dissolved |
| Comp. Ex. 5 | 30 | Mass generated |

When the polyphenylene ether obtained in the Examples was used, the dissolution time was about 1 minute and no adhesion was observed on the inner wall of the flask. In the case of polyphenylene ether obtained in Comparative Example 5, the dissolution time was 30 minutes and a mass of pellets was generated and adhered on the inner wall of the flask. The mass was hard to dissolve.

The present invention has been described in detail with reference to specific embodiments thereof. It will be apparent to one skilled in the art that various changes and modifications can be made therein without departing from the spirit and scope of this invention.

The present application is based on Japanese Patent Application (Japanese Patent Application No. 2002-63626) filed on Mar. 8, 2002 and the content thereof is expressly incorporated herein by reference.

INDUSTRIAL APPLICABILITY

In the present invention, the low molecular weight polyphenylene ether having a specific molecular weight distribution exhibits high thermal resistance and excellent electric properties, and exhibits excellent solubility in a solvent and reactivity by in case of the powder form. Thus, it is especially suitable for electronic materials and modifiers of other resin, Said low molecular weight polyphenylene ether can be produced efficiently according to the method of present invention.

The invention claimed is:

1. A process for producing a low molecular weight polyphenylene ether having a reduced viscosity ($\eta sp/c$), as measured at 30° C. in a 0.5 g/dl chloroform solution, of 0.04-0.18 dl/g, and a molecular weight distribution of 1.5-2.5, which comprises sequential the steps of:
polymerizing a phenol compound in the presence of a catalyst and oxygen-containing gas using a good solvent of said low molecular weight polyphenylene ether to obtain a polyphenylene ether solution; and
precipitating a low molecular weight polyphenylene ether having a reduced viscosity ($\eta sp/c$), as measured at 30° C. in a 0.5 g/dl chloroform solution, of 0.04-0.18 dl/g by adding a poor solvent of said low molecular weight polyphenylene ether to said polyphenylene ether solution,
wherein said precipitation is carried out at the temperature in the range of −80 to 20° C.

2. The process according to claim 1, wherein the poor solvent is an alcohol having 1-10 carbon atoms.

3. The process according to claim 1, wherein the poor solvent is at least one solvent selected from the group consisting of methanol, ethanol, propanol, butanol, pentanol, hexanol and ethylene glycol.

4. The process according to claim 2 or 3, wherein the poor solvent further comprises water.

5. A process for producing a low molecular weight polyphenylene ether having a reduced viscosity ($\eta sp/c$), as measured at 30° C. in a 0.5 g/dl chloroform solution, of 0.04-0.18 dl/g, and a molecular weight distribution of 1.5-2.5, which comprises the steps of:
polymerizing a phenol compound in the presence of a catalyst and oxygen-containing gas; and
precipitating a low molecular weight polyphenylene ether in the course of the polymerization,
wherein the ploymerization solvent is a mixture of at least two alcohols.

6. The process according to claim 5, wherein the polymerization solvent is a mixture of at least two alcohols having 1-10 carbon atoms.

7. The process according to claim 5, wherein the polymerization solvent is a mixture of at least two alcohols selected from the group consisting of methanol, ethanol, propanol, butanol, pentanol, hexanol and ethylene glycol.

8. The process according to claim 5, which further comprises the step of purifying a slurry comprising the precipitated low molecular weight polyphenylene ether by washing;
wherein the washing solvent is at least one solvent selected from the group consisting of methanol, ethanol, propanol, butanol, pentanol, hexanol and ethylene glycol.

9. The process according to claim 8, wherein the washing solvent further comprises water.

10. The process according to claim 8, which further comprises the step of removing the contained solvent from a washed low molecular weight polyphenylene ether by drying and devolatilization.

11. The process according to claim 5, which further comprises the steps of separating the low molecular weight polyphenylene ether from a slurry comprising the precipitated low molecular weight polyphenylene ether to obtain a wet low molecular weight polyphenylene ether, and removing the contained solvent from said wet low molecular weight polyphenylene ether by drying and devolatilization.

12. A low molecular weight polyphenylene ether which has a reduced viscosity ($\eta sp/c$), as measured at 30° C. in a 0.5 g/dl chloroform solution, of 0.04-0.18 dl/g, and a molecular weight distribution of 1.5-2.5, wherein
said low molecular weight polyphenylene ether is obtained by a process, which comprises the steps of;
polymerizing phenol compound in the presence to a catalyst and an oxygen-containing gas using a good solvent of said low molecular weight polyphenylene ether;
adding a poor solvent of said low molecular weight polyphenylene ether to the polyphenylene ether solution obtained by said polymerization; and
precipitating a low molecular weight polyphenylene ether at the temperature in the range of −80 to 20° C.

13. A low molecular weight polyphenylene ether which has a reduced viscosity ($\eta sp/c$), as measured at 30° C. in a 0.5 g/dl chloroform solution, of 0.04-0.18 dl/g, and a molecular weight distribution of 1.5-2.5, wherein said low molecular weight polyphenylene ether is obtained by a process, which comprises the steps of:

polymerizing a phenol compound in the presence of polymerization solvent, a catalyst and an oxygen-containing gas; and precipitating said low molecular weight polyphenylene ether in the course of the polymerization, wherein the polymerization solvent is a mixture of at least two alcohols.

14. The process according to claim 1, which further comprises the steps of purifying a slurry comprising the precipitated low molecular polyphenylene ether by washing;

wherein the washing solvent is at least one solvent selected from the group consisting of methanol, ethanol, propanol, butanol, pentanol, hexanol and ethylene glycol.

15. The process according to claim 14, wherein the washing solvent further comprises water.

16. The process according to claim 14, which further comprises the step of removing the contained solvent from a washed low molecular weight polyphenylene ether by drying and devolatilization.

17. The process according to claim 1, which farther comprises the steps of separating the low molecular weight polyphenylene ether from a slurry comprising the precipitated low molecular weight polyphenylene ether to obtain a wet low molecular weight polyphenylene ether, and removing the contained solvent from said wet low molecular weight polyphenylene ether by drying and devolatilization.

* * * * *